(12) United States Patent
Senzaki et al.

(10) Patent No.: US 9,676,934 B2
(45) Date of Patent: Jun. 13, 2017

(54) BLOCK COPOLYMER-CONTAINING COMPOSITION AND METHOD OF REDUCING PATTERN

(71) Applicant: Tokyo Ohka Kogyo Co., Ltd., Kawasaki-shi (JP)

(72) Inventors: Takahiro Senzaki, Kawasaki (JP); Ken Miyagi, Kawasaki (JP); Kenichiro Miyashita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/788,212

(22) Filed: Mar. 7, 2013

(65) Prior Publication Data

US 2013/0240481 A1 Sep. 19, 2013

(30) Foreign Application Priority Data

Mar. 8, 2012 (JP) .................. 2012-052009

(51) Int. Cl.
*C03C 15/00* (2006.01)
*C08L 53/00* (2006.01)
(Continued)

(52) U.S. Cl.
CPC ............... *C08L 53/00* (2013.01); *B05D 5/00* (2013.01); *G03F 7/0002* (2013.01)

(58) Field of Classification Search
CPC .. C08L 53/00; C08L 2666/02; C08L 2666/24; C08L 33/12; B81C 1/00031;
(Continued)

(56) References Cited

U.S. PATENT DOCUMENTS 6,565,763 B1 5/2003 Asakawa et al.
8,114,306 B2 * 2/2012 Cheng et al. ................. 216/41
(Continued)

FOREIGN PATENT DOCUMENTS

JP A-2001-151834 6/2001
JP A-2007-055235 3/2007
(Continued)

OTHER PUBLICATIONS

Proceedings of SPIE, vol. 7637, 76370G-1, 2010.
(Continued)

*Primary Examiner* — Lan Vinh
*Assistant Examiner* — Christopher Remavege
(74) *Attorney, Agent, or Firm* — Knobbe, Martens, Olson & Bear, LLP

(57) ABSTRACT

The present invention relates to a composition including: a component (A) being a block copolymer including a block $P_A$ bonded to one, or two or more blocks incompatible with the block $P_A$ and whose etching selectivity to the block $P_A$ is greater than one; and a component (B) being at least one polymer selected from the group consisting of a random copolymer and a homopolymer, wherein the polymer of the component (B) is compatible with at least one block other than the block $P_A$ within the blocks constituting the block copolymer of the component (A), and is incompatible with the block $P_A$.

2 Claims, 1 Drawing Sheet

| HOLE PATTERN PRIOR TO REDUCING | COMPOSITION 1 (70/280nm) | COMPOSITION 2 (70/140nm) | COMPOSITION 3 (70/210nm) | COMPOSITION 4 (70/280nm) |
|---|---|---|---|---|

(51) Int. Cl.
  *B05D 5/00*   (2006.01)
  *G03F 7/00*   (2006.01)

(58) Field of Classification Search
  CPC .... B81C 2201/0149; B81C 2201/0198; B82Y
       30/00; G03F 7/26; G03F 7/265; G03F
       7/40; G03F 7/0002; B05D 5/00
  USPC ............... 216/17, 41, 46, 49; 257/E21.035,
       257/E21.038, E21.039; 438/780, 947
  See application file for complete search history.

(56) References Cited

U.S. PATENT DOCUMENTS

| | | | |
|---|---|---|---|
| 8,133,534 B2* | 3/2012 | Stoykovich et al. | ......... 427/256 |
| 8,173,034 B2* | 5/2012 | Millward et al. | ............... 216/41 |
| 2003/0173568 A1 | 9/2003 | Asakawa et al. | |
| 2003/0222048 A1 | 12/2003 | Asakawa et al. | |
| 2004/0050816 A1 | 3/2004 | Asakawa et al. | |
| 2005/0112886 A1 | 5/2005 | Asakawa et al. | |
| 2006/0279025 A1 | 12/2006 | Heidari et al. | |
| 2007/0212522 A1 | 9/2007 | Heidari et al. | |
| 2009/0020924 A1 | 1/2009 | Lin | |
| 2009/0042146 A1 | 2/2009 | Kim et al. | |
| 2009/0200646 A1* | 8/2009 | Millward et al. | ............. 257/632 |
| 2009/0236309 A1 | 9/2009 | Millward et al. | |
| 2010/0297847 A1* | 11/2010 | Cheng et al. | ................. 438/694 |
| 2012/0003587 A1 | 1/2012 | Kim et al. | |
| 2013/0209694 A1* | 8/2013 | Chang et al. | ................. 427/379 |

FOREIGN PATENT DOCUMENTS

| | | |
|---|---|---|
| JP | A-2008-036491 | 2/2008 |
| JP | A-2008-109152 | 5/2008 |
| JP | A-2008-520450 | 6/2008 |
| JP | A-2009-042760 | 2/2009 |
| JP | A-2009-234114 | 10/2009 |
| JP | A-2011-515537 | 5/2011 |
| JP | A-2013-163810 | 8/2013 |
| WO | WO 2006/112887 A2 | 10/2006 |
| WO | WO 2009/117243 | 9/2009 |

OTHER PUBLICATIONS

Gokan et al., Journal of The Electrochemical Society, pp. 143-146, vol. 130, Issue 1 (1983).

Office Action in Japanese Patent Application No. 2012-052009, mailed Oct. 20, 2015.

Craig, Gordon S.W., et al., The Use of Block Copolymers in Nanoscale Patterning, http://www.sigmaaldrich.com/technical-documents/articles/material-matters/use-of-block-copolymers-in-nanoscale-patterning.html (downloaded Feb. 8, 2016).

* cited by examiner

BLOCK COPOLYMER-CONTAINING COMPOSITION AND METHOD OF REDUCING PATTERN

TECHNICAL FIELD

The present invention is related to a method of reducing a pattern formed within a thin film on a substrate by using a phase-separated structure of a block copolymer, and a block copolymer-containing composition used in the method.

Priority is claimed on Japanese Patent Application No. 2012-052009, filed Mar. 8, 2012, the content of which is incorporated herein by reference.

DESCRIPTION OF RELATED ART

Recently, as further miniaturization of large-scale integrated circuits (LSI) proceeds, a technology for processing a more delicate structure is demanded. In response to such a demand, a method has been disclosed in which a fine pattern is formed using a phase-separated structure formed by self-assembly of a block copolymer having mutually incompatible blocks bonded together (see, for example, Patent Document 1).

For using a phase separation of a block copolymer, it is necessary to form a self-organized nano structure by a microphase separation only in specific regions, and arrange the nano structure in a desired direction. For realizing position control and orientational control, graphoepitaxy to control a phase-separated pattern by a guide pattern and chemical epitaxy to control a phase-separated pattern by a difference in the chemical state of the substrate are proposed (see, for example, Non-Patent Document 1).

Further, with respect to a contact hole pattern formed on a resist film, the hole diameter and the shape tend to vary greatly as the hole diameter becomes smaller. In this situation, a method has been proposed in which a block copolymer is applied to a resist film having a contact hole pattern formed thereon, and a phase-separated structure having a cylinder structure is formed, followed by selectively removing a phase constituting the center of the cylinder structure, thereby forming a contact hole having a relatively uniform hole diameter compared with the first contact hole pattern (see, for example, Patent Document 2).

DOCUMENTS OF RELATED ART

Patent Document

[Patent Document 1] Japanese Unexamined Patent Application, First Publication No. 2008-36491

[Patent Document 2] U.S. Publication No. 2010/0297847

Non-Patent Documents

[Non-Patent Document 1] Proceedings of SPIE (U.S.), vol. 7637, pp. 76370G-1 (2010)

SUMMARY OF THE INVENTION

Patent Document 2 describes that a reduction of a circular contact hole pattern can improve uniformity of the hole diameter and circularity thereof and a contact hole into which a plurality of contact holes are united can be separated into individual contact holes. However, with respect to shapes except for a circular hole pattern, a method of forming the pattern reflecting the original pattern and reduced from the originally formed pattern by using a phase-separated structure of a block copolymer has not been achieved yet.

The present invention takes the above circumstances into consideration, with an object of providing a method of reducing a pattern formed within a thin film on a substrate by using a phase-separated structure of a block copolymer.

For solving the above-mentioned problems, the present invention employs the following aspects.

Specifically, a first aspect of the present invention is a composition including: a component (A) being a block copolymer including a block $P_A$ bonded to one, or two or more blocks incompatible with the block $P_A$ and whose etching selectivity to the block $P_A$ is greater than one; and a component (B) being at least one polymer selected from the group consisting of a random copolymer and a homopolymer, wherein the polymer of the component (B) is compatible with at least one block other than the block $P_A$ within the blocks constituting the block copolymer of the component (A), and is incompatible with the block $P_A$, wherein the etching selectivity of the polymer of the component (B) to the block $P_A$ is 1.1 or greater.

Further, a second aspect of the present invention is a method of reducing a pattern including: forming a block copolymer layer such that a layer containing a block copolymer is formed on a substrate having a thin film with a pattern formed on a surface thereof using the composition according to the first aspect, so as to cover the bottom of concave portions of the pattern; separating a phase such that the layer containing the block copolymer is subjected to phase separation after forming the block copolymer layer; and selectively removing a phase of blocks other than the block $P_A$ within the layer constituting the block copolymer after separating the phase, wherein the thin film is an organic or inorganic film that is photosensitive or non-photosensitive.

According to the present invention, starting from an original pattern formed on a thin film such as a resist film, regardless of the original pattern shape, a pattern reflecting the original pattern shape and reduced from the originally formed pattern can be formed.

DETAILED DESCRIPTION OF THE INVENTION

[Composition]

Figure 1:
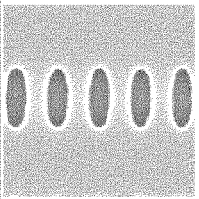
FIG. 1 is scanning electron microscope micrographs, with respect to Example 1, of the surface of a substrate in which hole patterns having ellipse shapes are formed (indicates "prior to reducing"), and of each surface of substrates in which the compositions 1 to 4 are applied thereto, phase-separated structures are formed, and then PMMA phases are removed.

The composition of the present invention includes a component (A) being a block copolymer in which a block $P_A$ and one, or two or more blocks incompatible with the block $P_A$ and whose etching selectivity to the block $P_A$ is greater than one are combined; and a component (B) being at least one polymer selected from the group consisting of a random copolymer and a homopolymer, wherein the polymer of the component (B) is compatible with at least one block other than the block $P_A$ within the blocks constituting the block copolymer of the component (A), and is incompatible with the block $P_A$, wherein the etching selectivity of the polymer of the component (B) to the block $P_A$ is 1.1 or greater.

When an etching treatment is conducted after a phase separation of a layer composed of the block copolymer, a phase having the smallest etching rate can remain, and the other phases can be selectively removed.

The layer composed of the block copolymer is formed so as to cover concave portions of the pattern formed on the thin film, is subjected to the phase separation, and then the specific phases are selectively removed. In this manner, a pattern constituted of the remaining phase can be formed within concave portions of the originally formed pattern. In the present invention, when a phase-separated structure is formed within concave portions of a pattern in the presence of a polymer compatible with blocks constituting a phase selectively removed by the etching treatment, the phase selectively removed by the etching treatment can be expanded in terms of volume thereof As a result, the remaining phase after the etching treatment can be formed along the periphery of concave portions of the originally formed pattern.

If the composition does not include the polymer of the component (B), in formation of the phase-separated structure, two or more patterns not reflecting the shape of the pattern (indicates "pattern prior to reducing") originally formed on the thin film may be formed. In contrast, when the polymer of the component (B) is added thereto, only one reduced pattern in which the shape of the originally formed pattern is reflected can be formed per one pattern originally formed. For example, in the case where a pattern originally formed on the thin film is a hole pattern having an ellipse shape, if the polymer of the component (B) is not added thereto, two or more circular hole patterns are formed per one original elliptically-shaped hole pattern. On the other hand, if the polymer of the component (B) is added thereto, one reduced hole pattern in which the original elliptically-shaped shape is reflected can be formed per one hole pattern originally formed.

<Component (A): Block Copolymer>

A block copolymer is a polymeric material in which a plurality of blocks are bonded. As the blocks constituting the block copolymer, two types of blocks may be used, or three or more types of blocks may be used.

The block copolymer used in the present invention is able to form a phase-separated structure, and is a combination in which a phase of at least one block amongst the plurality of blocks constituting the block copolymer can be easily subjected to selective removal as compared to the phases of other blocks.

The block copolymer of the component (A) is a block copolymer in which a block $P_A$ and one, or two or more blocks incompatible with the block $P_A$ and whose etching selectivity to the block $P_A$ is greater than one are combined.

The block $P_A$ has the smallest etching rate among each block of the block copolymer. Therefore, when the phase-separated structure formed using the block copolymer of the component (A) is subjected to the etching treatment, the phase constituted of the other blocks can be removed to selectively leave only the phase constituted of the block $P_A$.

As the block other than the block $P_A$ (hereafter, frequently referred to as "block $P_B$") among the blocks constituting the block copolymer of the component (A), one type of block may be used, or two or more types may be used in combination. When two or more types of block $P_B$ are used, each block $P_B$ may be incompatible with the other block $P_B$, or may be compatible with the other block $P_B$.

The block $P_B$ is not limited as long as it is incompatible with the block $P_A$ and etching selectivity thereof to the block $P_A$ is greater than one. The block $P_B$ can be appropriately determined, taking into consideration the type of block $P_A$, the type of etching treatment to be performed, and the like. As the block $P_B$ constituting the block copolymer of the component (A), etching selectivity thereof to the block $P_A$ is preferably 1.1 or greater, and more preferably 2.0 or greater.

As an indicator of etching resistance of a polymer, the "Ohnishi parameter" can generally be used (J. Electrochem Soc, 143, 130 (1983), H. Gokan, S. Esho and Y. Ohnishi). The Ohnishi parameter is used in general to indicate the carbon density of a polymer, and is specifically determined by formula "[the combined total number of carbon atoms, hydrogen atoms and oxygen atoms]/([the number of carbon atoms]−[the number of oxygen atoms])". The increase of the carbon density of a polymer per unit volume (that is, the decrease of the Ohnishi parameter) improves the etching resistance thereof.

The block $P_B$ constituting the block copolymer of the component (A) preferably has a greater Ohnishi parameter than that of the block $P_A$, more preferably has a greater Ohnishi parameter by 0.4 or more than that of the block $P_A$, and still more preferably has a greater Ohnishi parameter by one or more than that of the block $P_A$.

Examples of the block copolymer include a block copolymer having a block with a structural unit of styrene or a derivative thereof bonded to a block with a structural unit of a (meth)acrylate ester, a block copolymer having a block with a structural unit of styrene or a derivative thereof bonded to a block with a structural unit of a siloxane or a derivative thereof, and a block copolymer having a block with a structural unit of an alkylene oxide bonded to a block with a structural unit of a (meth)acrylate ester. Here, the term "(meth)acrylate ester" is a generic term that includes either or both of the acrylate ester having a hydrogen atom bonded to the α-position and the methacrylate ester having a methyl group bonded to the α-position.

As the (meth)acrylate ester, for example, (meth)acrylic acid having a substituent such as an alkyl group or a hydroxyalkyl group bonded to the carbon atom of the (meth)acrylic acid can be used. Examples of the alkyl group as the substituent include linear, branched or cyclic alkyl groups of 1 to 10 carbon atoms. Specific examples of the (meth)acrylate ester include methyl (meth)acrylate, ethyl (meth)acrylate, propyl (meth)acrylate, cyclohexyl (meth)acrylate, octyl (meth)acrylate, nonyl (meth)acrylate, hydroxyethyl (meth)acrylate, hydroxypropyl (meth)acrylate, benzyl (meth)acrylate, anthracene (meth)acrylate, glycidyl (meth)acrylate, 3,4-epoxycyclohexylmethane (meth)acrylate, and propyltrimethoxysilane (meth)acrylate.

Examples of the styrene derivative include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, vinylcyclohexane, 4-vinylbenzylchloride, 1-vinylnaphthalene, 4-vinylbiphenyl, 1-vinyl-2-pyrolidone, 9-vinylanthracene, and vinylpyridine.

Examples of the siloxane derivative include dimethylsiloxane, diethylsiloxane, diphenylsiloxane, and methylphenylsiloxane.

Examples of the alkylene oxide include ethylene oxide, propylene oxide, isopropylene oxide and butylene oxide.

In the present invention, it is preferable to use a block copolymer having a block with a structural unit of styrene or a derivative thereof bonded to a block with a structural unit of a (meth)acrylate ester. Specific examples thereof include a polystyrene-poly(methyl methacrylate) (PS-PMMA) block copolymer, a polystyrene-poly(ethyl methacrylate) block copolymer, a polystyrene-poly(t-butyl methacrylate) block copolymer, a polystyrene-poly(methacrylic acid) block copolymer, a polystyrene-poly(methyl acrylate) block copolymer, a polystyrene-poly(ethyl acrylate) block copolymer, a polystyrene-poly(t-butyl acrylate) block copolymer, and a polystyrene-poly(acrylic acid) block copolymer. In the present invention, it is particularly preferable to use a PS-PMMA block copolymer. When a layer containing the PS-PMMA block copolymer is subjected to a phase separation and then the layer is subjected to an etching treatment (for example, a decomposition treatment and a developing solution treatment can be performed), the phase constituted of PMMA can be selectively removed. Hence, in such a case, the PS indicates a block $P_A$, and the PMMA indicates a block $P_B$.

The weight average molecular weight (Mw) (the polystyrene equivalent value determined by gel permeation chromatography) of each block constituting the block copolymer is not particularly limited as long as it is large enough to cause phase separation. The weight average molecular weight is preferably 5,000 to 500,000, more preferably 5,000 to 400,000, and still more preferably 5,000 to 300,000.

The polydispersity (Mw/Mn) of the block copolymer is preferably 1.0 to 3.0, more preferably 1.0 to 1.5, and still more preferably 1.0 to 1.2. Here, Mn is the number average molecular weight.

By appropriately controlling the compositional ratio of each block constituting the block copolymer and the weight average molecular weight of the block copolymer, the shape of each phase of the phase-separated structure to be obtained can be adjusted. In a method of reducing a pattern described later, the original pattern is reduced by the phase constituted of the block $P_A$. Therefore, by increasing the weight average molecular weight of the block $P_A$ constituting the block copolymer of the component (A), in the method of reducing a pattern described later, the reduction ratio (namely, the ratio between the size of the original pattern and the size of the reduced pattern: [the size of reduced pattern]/[the size of original pattern]) can be decreased.

<Component (B): Block Copolymer>

The polymer of the component (B) is compatible with at least one block other than the block $P_A$ (namely, block $P_B$) among the blocks constituting the block copolymer of the component (A), and is incompatible with the block $P_A$. When the block copolymer of the component (A) is constituted of two or more types of the block $P_B$, the polymer of the component (B) may be compatible with at least one type of the block $P_B$, but it is preferably compatible with all the blocks $P_B$.

When the polymer of the component (B) is incompatible with the block $P_A$ and compatible with the block $P_B$, by conducting a phase separation of the block copolymer of the component (A) in the presence of the polymer of the component (B), the polymer of the component (B) constitutes a phase with the block $P_B$. In this manner, when the composition of the present invention is subjected to the phase separation, the phase constituted of the block $P_B$ is more expanded by the volume of the polymer of the component (B) as compared to a composition including no polymer of the component (B).

As long as the effects of the present invention are not adversely affected, the polymer of the component (B) may be a random copolymer or a homopolymer. Further, as the polymer of the component (B) contained in the composition of the present invention, one type of block may be used, or two or more types may be used in combination. When two or more types of polymer are contained therein as the polymer of the component (B), these polymers may be incompatible with each other, but it is preferable they be compatible with each other.

Generally, when polymers have a large difference to each other in surface free energy thereof, the polymers tend to have a low compatibility to each other, as compared to compatibility of polymers having a small difference in surface free energy. Therefore, the polymer of the component (B) preferably has relatively large difference in surface free energy from that of the block $P_A$. For example, the difference of the polymer of the component (B) to the block $P_A$ in surface free energy is preferably 0.5 mJ/m$^2$ or more, and more preferably 1.5 mJ/m$^2$ or more. On the other hand, the polymer of the component (B) also preferably has relatively small difference in surface free energy from that of the block $P_B$. For example, the difference of the polymer of the component (B) to the block $P_B$ in surface free energy is preferably 5.0 mJ/m$^2$ or less, more preferably 0.5 mJ/m$^2$ or less, and still more preferably 0.0 mJ/m$^2$.

The polymer of the component (B) has the etching selectivity of 1.1 or greater to the block $P_A$. Therefore, when the phase-separated structure composed of the composition according to the present invention is subjected to an etching treatment, the polymer of the component (B) can be removed similarly to block $P_B$, faster than the phase constituted of the block $P_A$. The polymer of the component (B) preferably has the etching selectivity of 1.5 or greater to the block $P_A$, and more preferably 2.0 or greater.

Further, the polymer of the component (B) preferably has a greater Ohnishi parameter than that of the block $P_A$, more preferably has a greater Ohnishi parameter by 0.4 or more than that of the block $P_A$, and still more preferably has a greater Ohnishi parameter by one or more than that of the block $P_A$.

As the polymer of the component (B), a polymer constituted by a different type of monomer from the monomers constituting the block $P_B$, or a polymer constituted by the same type of monomer as the monomers constituting the block $P_B$ may be used. When the same type of polymer as the block $P_B$ is used as the polymer of the component (B), the polymer of the component (B) and the block $P_B$ within the block copolymer of the component (A) exhibit excellent compatibility. As a result, adverse affects can be suppressed to the minimum in the formation of the phase-separated structure.

When the block copolymer of the component (A) is a block copolymer such as a PS-PM MA block copolymer, including a block with a structural unit of styrene or a derivative thereof bonded to a block with a structural unit of a (meth)acrylate ester (that is, when the block copolymer of the component (A) is the PS-PMMA block copolymer or the like), in terms of etching selectivity, the polymer of the component (B) preferably has an Ohnishi parameter of 2.4 or more, and more preferably 3.0 or more.

When the block copolymer of the component (A) is the PS-PMMA block copolymer or the like, the polymer of the component (B) preferably has a relatively high polarity. The polymer of the component (B) preferably has a surface free energy of 46.0 mJ/m$^2$ or less, and more preferably 44.5 mJ/m$^2$ or less.

As such a polymer of the component (B), a polymer having a structural unit derived from a (meth)acrylic acid or a (meth)acrylate ester within the main chain thereof (an acrylic polymer) can be mentioned. As the (meth)acrylate ester, the same as those described above for the (meth) acrylate ester can be used.

Specific examples of the acrylic polymer includes a poly(methyl acrylate), a poly(methyl methacrylate), a poly (ethyl acrylate), a poly(ethyl methacrylate), a poly(t-butyl acrylate), a poly(t-butyl methacrylate), a poly(acrylic acid), a poly(methacrylic acid), a poly(adamantyl acrylate), poly (adamantyl methacrylate) and the like. When the block copolymer of the component (A) is the PS-PMMA block copolymer, it is particularly desirable that the polymer of the component (B) is the poly(methyl methacrylate).

The weight average molecular weight of the polymer of the component (B) is not particularly limited as long as it is sufficient enough to prevent the phase separation of the block copolymer of the component (A) from being inhibited, but is preferably 20 times or less than the weight average molecular weight of the block P$_B$ constituting the block copolymer of the component (A), more preferably 10 times or less, and still more preferably 5 times or less. Further, the polydispersity (Mw/Mn) of the polymer of the component (B) is preferably 1.0 to 5.0, more preferably 1.0 to 4.0, and still more preferably 1.0 to 3.0.

In a method of reducing a pattern described later, the phase constituted of the block P$_B$ and the polymer of the component (B) acts as a concave portion of the pattern after the reduction. Hence, by appropriately controlling the volume fraction of the polymer of the component (B) in the summation of the block copolymer of the component (A) and the polymer of the component (B), the area of the reduced pattern can be adjusted into a desired area. For example, when an original pattern has a large area in the concave portions, by increasing the volume fraction of the polymer of the component (B) in the summation of the block copolymer of the component (A) and the polymer of the component (B), a pattern reflecting the original pattern shape and reduced from the originally formed pattern can be formed.

When an insufficient amount of the polymer of the component (B) is contained in the composition of the present invention, in the case where the composition is used in a method of reducing a pattern described later, it may be difficult to obtain the desired reduced pattern. On the other hand, when an excessive amount of the polymer of the component (B) is contained in the composition of the present invention, there is a concern that the phase separation of the block copolymer of the component (A) is inhibited. In the composition of the present invention, the amount of polymer of the component (B) can be appropriately determined, taking into consideration the shape and size of the original pattern, desired reduction ratio and the like, although it is preferably 10 to 500 parts by weight relative to 100 parts by weight of the block copolymer of the component (A), more preferably 10 to 300 parts by weight, and still more preferably 10 to 200 parts by weight.

[Method of Reducing a Pattern]

The method of reducing a pattern of the present invention is a method of reducing a pattern formed within a thin film on a substrate by using a phase-separated structure of the composition according to the present invention. Specifically, the method of reducing a pattern of the present invention includes the following steps of:

forming a block copolymer layer such that a layer containing a block copolymer is formed on a substrate having a thin film with a pattern formed on a surface thereof using the composition according to the present invention, so as to cover the bottom of concave portions of the pattern;

separating a phase such that the layer containing the block copolymer is subjected to phase separation after forming the block copolymer layer; and selectively removing a phase of blocks other than the block P$_A$ within the layer constituting the block copolymer after separating the phase.

Hereafter, each of the steps and the materials used will be explained in detail.

<Substrate>

The substrate is not particularly limited, as long as a thin film can be formed on a surface thereof, followed by forming a pattern on the thin film. Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

Further, the size and the shape of the substrate used in the present invention is not particularly limited. The substrate does not necessarily need to have a smooth surface, and a substrate made of various materials and having various shapes can be appropriately selected for use. For example, a multitude of shapes can be used, such as a substrate having a curved surface, a plate having an uneven surface, and a thin sheet.

Further, on the surface of the substrate, an inorganic and/or organic film may be provided. As the inorganic film, an inorganic antireflection film (inorganic BARC) can be used. As the organic film, an organic antireflection film (organic BARC) can be used.

<Substrate-Washing Treatment>

Before forming a thin film on the substrate, the surface of the substrate may be washed. By washing the surface of the substrate, the later thin film-forming step may be satisfactorily performed.

As the washing treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a layer containing a block copolymer can be formed on the surface of the substrate.

<Neutralization Treatment>

Before forming a thin film on the substrate, the substrate may be subjected to a neutralization treatment. In the case where a pattern is formed on the thin film, the surface of the substrate prior to the lamination of the thin film becomes the bottom of a concave portion of the pattern. Thus, by subjecting the substrate to a neutralization treatment prior to formation of a thin film, the bottom of the concave portions of the pattern can be rendered a surface subjected to a neutralization treatment. A neutralization treatment is a treatment in which the surface of the substrate is modified so as to have affinity to all blocks constituting the block copolymer. By the neutralization treatment, it becomes possible to prevent only phases of specific blocks to come into contact with the surface of the substrate by phase separation, and it becomes possible to more reliably arrange each phase in a perpendicular direction of the substrate surface.

A specific example of the neutralization treatment includes a treatment in which a thin film (neutralization film) containing a base material having affinity to all blocks constituting the block copolymer is formed on the surface of the substrate.

As the neutralization film, a film composed of a resin composition can be used. The resin composition used as the base material can be appropriately selected from conventional resin compositions used for forming a thin film, depending on the type of blocks constituting the block copolymer. The resin composition used as the base material may be a heat-polymerizable resin composition, or a photosensitive resin composition such as a positive resist composition or a negative resist composition.

Alternatively, the neutralization film may be a non-polymerizable film. For example, a siloxane organic monomolecular film such as phenethyltrichlorosilane, octadecyltrichlorosilane or hexamethyldisilazane may be preferably used as a neutralization film.

The neutralization film composed of such base materials can be formed by a conventional method.

Examples of the base material include a resin composition containing all structural units of the blocks constituting the block copolymer, and a resin containing all structural units having high affinity to the blocks constituting the block copolymer.

For example, when a PS-PMMA block copolymer is used, as the base material, it is preferable to use a resin composition containing both PS and PMMA as the structural units, or a compound or a composition containing both a portion having a high affinity to PS such as an aromatic ring and a portion having a high affinity to PMMA such as a functional group with high polarity.

Examples of the resin composition containing both PS and PMMA as the structural units include a random copolymer of PS and PMMA, and an alternating block of PS and PMMA (a copolymer in which the respective monomers are alternately copolymerized).

Examples of the composition containing both a portion having a high affinity to PS and a portion having a high affinity to PMMA include a resin composition obtained by polymerizing at least a monomer having an aromatic ring and a monomer having a substituent with high polarity. Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom. Examples of the monomer having a substituent with high polarity include a monomer having a trimethoxysilyl group, a trichlorosilyl group, a carboxy group, a hydroxy group, a cyano group or a hydroxyalkyl group in which part of the hydrogen atoms of the alkyl group has been substituted with fluorine atoms.

Examples of the compound containing both a portion having a high affinity to PS and a portion having a high affinity to PMMA include a compound having both an aryl group such as a phenethyltrichlorosilane and a substituent with high polarity, and a compound having both an alkyl group and a substituent with high polarity, such as an alkylsilane compound.

<Formation of Thin Film Having Pattern Formed Thereon>

On the surface of the substrate, before forming a layer containing the block copolymer, a thin film having a pattern formed thereon is formed. The thin film may be a photosensitive film or a non-photosensitive film. Further, the thin film may be an organic film or an inorganic film. In the present invention, a photosensitive or non-photosensitive organic film is preferable, and a photosensitive or non-photosensitive resist film is more preferable.

The method of forming a resist film having a pattern formed thereon is not particularly limited, and can be appropriately selected from the conventional methods for forming a pattern on a resist film. In the case of a photolithography method, for example, on a surface of a substrate which has been subjected to a washing treatment or a neutralization treatment if desired, a film composed of a resist composition is formed. Then, a selective exposure is conducted using a radial ray such as light or electron beam through a mask pattern having a predetermined pattern, followed by a development treatment, thereby forming a resist film having a pattern formed thereon.

The resist composition for forming the pattern can be appropriately selected from resist compositions or a modified product thereof typically used for forming a resist pattern. The resist composition may be a positive resist composition or a negative resist composition.

Further, the developing solution used in the development may be an alkali developing solution or an organic developing solution containing an organic solvent.

For example, a pattern can be formed by using a positive resist composition containing a base component which exhibits increased solubility in an alkali developing solution under action of an acid and an acid-generator component which generates acid upon exposure. In the positive resist composition, when radial rays are irradiated (when exposure is conducted), acid is generated from the acid-generator component, and the polarity of the base component is increased by the action of the acid, thereby increasing the solubility of the base component in an alkali developing solution. Therefore, in the formation of a pattern, by conducting selective exposure of a resist film formed by using the resist composition, the solubility of the exposed portions in an alkali developing solution is increased, whereas the unexposed portions remain hardly soluble in an alkali, and hence, a hole pattern can be formed by alkali development to remove the exposed portions, thereby forming a pattern. As the positive resist composition, a positive resist composition that includes a base component which exhibits increased solubility in an alkali developing solution under action of an acid and generates acid upon exposure can be used.

More specifically, for example, a positive resist composition is applied to a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a mask having a pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a pattern that is faithful to the mask pattern can be formed.

Alternatively, a pattern can be formed by using a negative-tone development resist composition containing a base component which exhibits decreased solubility in a developing solution containing an organic solvent under action of an acid and an acid-generator component which generates acid upon exposure. In the negative tone-development resist composition, when radial rays are irradiated (when exposure is conducted), acid is generated from the acid-generator component, and the solubility of the base component in an organic solvent is decreased by the action of the acid. Therefore, in the formation of a pattern, by conducting selective exposure of a resist film formed by using the resist composition, the solubility of the exposed portions in a developing solution containing an organic developing solution is decreased, whereas the solubility of the unexposed portions in an organic developing solution is unchanged, and hence, a pattern can be formed by removing the unexposed portions by negative tone development using an organic developing solution.

Alternatively, a pattern can be formed by using a negative resist composition containing a base component which is soluble in an alkali developing solution, an acid-generator component which generates acid upon exposure, and a cross-linking agent. In the negative resist composition, when acid is generated from the acid-generator component upon exposure, the action of the generated acid causes cross-linking between the base component and the cross-linking agent, and the cross-linked portion becomes hardly soluble in an alkali developing solution. Therefore, in the formation of a pattern, by conducting selective exposure of a resist film formed by using the resist composition, the exposed portions becomes hardly soluble in an alkali developing solution, whereas the unexposed portions remain soluble in an alkali developing solution, and hence, a hole pattern can be formed by alkali development to remove the unexposed portions, thereby forming a pattern.

Furthermore, a pattern can be formed using an etching treatment. For example, on a surface of a substrate which has been subjected to a washing treatment or a neutralization treatment if desired, a resist composition is coated to form a resist film. Then, a mask having a pattern and dry etching resistance is provided on the resist film, followed by dry etching treatment, thereby forming a resist film having a pattern formed thereon. Examples of the dry etching treatment include an oxygen plasma treatment, a hydrogen plasma treatment, an ozone treatment and a UV irradiation treatment.

Further, a pattern can be formed by a wet etching treatment. Specifically, a non-photosensitive resist film is formed on a surface of a substrate, and a photosensitive resist film is laminated on the non-photosensitive resist film, followed by forming a pattern on the photosensitive resist film. Thereafter, by using an organic solvent in which the non-photosensitive resist film exhibits a higher solubility than the photosensitive resist film, the non-photosensitive resist film is dissolved and removed in regions where the non-photosensitive resist film is not masked by the pattern, thereby forming a pattern on the non-photosensitive resist film. As the non-photosensitive resist film, a silica film such as a film containing $SiO_2$ as a main component can be preferably used. A film containing $SiO_2$ as a main component can be formed, for example, by applying a solution obtained by dissolving a silicon compound in an organic solvent, and a film can be formed by a spin-on-glass method (SOG method) involving a heat treatment, a chemical vapor deposition method, or the like. Further, the photosensitive resist composition can be appropriately selected from resist compositions or a modified product thereof typically used for forming a resist pattern.

The resist composition for forming the pattern can be appropriately selected from resist compositions or a modified product thereof typically used for forming a resist pattern which have affinity to any of the blocks constituting the block copolymer. In the present invention, by conducting the phase separation, the phase constituted of the block $P_A$ is formed along the periphery of concave portions of the originally formed pattern. Accordingly, the resist composition for forming the pattern preferably has affinity to the block $P_A$.

When an organic solvent solution of the block copolymer is cast onto the substrate having a pattern formed thereon, a heat treatment is conducted to cause a phase separation. Therefore, the resist pattern for forming a pattern is preferably capable of forming a resist film which exhibits solvent resistance and heat resistance.

The shape of the pattern formed on the thin film is not particularly limited. The shape of the pattern formed on the thin film may be any one of a hole pattern having a circular shape in a cross-section parallel to the substrate, a hole pattern having an ellipse shape of the cross-section, a hole pattern having a polygonal shape in the cross-section, and a line and space pattern, and it may also be a pattern in which these patterns are appropriately combined. An example of the hole pattern having a polygonal shape in the cross-section includes a hole pattern having a square shape in the cross-section such as a grid-like shape.

<Block Copolymer Layer-forming Step>

In the present invention, firstly, a layer containing a block copolymer is formed using the composition of the present invention on a substrate having a thin film with a pattern formed on a surface thereof, so as to cover the bottom of concave portions of the pattern. More specifically, the composition of the present invention dissolved in a suitable organic solvent is applied to the thin film using a spinner or the like.

As the organic solvent for dissolving the composition of the present invention, any organic solvent which is capable of dissolving the block copolymer of the component (A) and the polymer of the component (B) included in the composition, and forming a uniform solution can be used. For example, an organic solvent having high compatibility with all of the polymer of the component (B) and each block constituting the block copolymer of the component (A) can be used. As the organic solvent, one type of solvent can be used, or two or more types may be used in combination.

Examples of the organic solvent for dissolving the composition of the present invention include lactones such as γ-butyrolactone;

ketones such as acetone, methyl ethyl ketone, cyclohexanone, methyl-n-pentyl ketone, methyl isopentyl ketone, and 2-heptanone;

polyhydric alcohols, such as ethylene glycol, diethylene glycol, propylene glycol and dipropylene glycol;

compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable);

cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

For example, when a PS-PMMA block copolymer is used as the block copolymer, it is preferable to dissolve the block copolymer in an aromatic organic solvent such as toluene, PGMEA, or the like.

The lower limit of the thickness of the layer containing the block copolymer formed using the composition of the present invention can be a thickness sufficient for a phase separation to occur, and can be appropriately selected taking into consideration the periodic structure size of the phase-separated structure to be formed. Further, in the present invention, the thickness of the layer containing the block copolymer is preferably not more than the height from the surface of the substrate (alternatively, the surface of the neutralization film) within the concave portion of the pattern formed on the thin film to the convex portion of pattern.

<Phase Separation Step>

The substrate having the layer containing the block copolymer formed thereon is subjected to an annealing treatment, so as to cause a phase separation of the layer containing the block copolymer. As a result, the phase constituted of the block $P_A$ is formed along the periphery of concave portions of the originally formed pattern, and the phase constituted of the block $P_B$ and the polymer of the component (B) is formed inside the phase constituted of the block $P_A$.

The annealing treatment can be any treatment which is used for causing phase separation of the block copolymer, such as a heat annealing treatment or a solvent annealing treatment. Specifically, in a heat annealing treatment, the substrate having the layer containing the block copolymer formed thereon is subjected to a heat treatment. The heat treatment is preferably conducted at a temperature at least as high as the glass transition temperature of the block copolymer used and lower than the heat decomposition temperature. Further, the heat treatment is preferably conducted in a low reactive gas such as nitrogen.

On the other hand, the solvent annealing treatment is a method in which the annealing treatment is conducted in a state where the substrate having the layer containing the block copolymer formed thereon is exposed to a vapor of a good solvent for a polymeric block copolymer composition. In the solvent annealing treatment, the substrate exposed to the vapor of the good solvent may be further subjected to a heat treatment. Specifically, for example, the substrate having the layer containing the block copolymer formed thereon is placed in a desiccator with a good solvent for a polymeric block copolymer composition, and allowed to stand. Alternatively, a nitrogen gas may be bubbled in a good solvent for a polymeric block copolymer composition to obtain a good solvent vapor-containing nitrogen gas, and the substrate having the layer containing the block copolymer formed thereon may be subjected to a heat treatment in a state where the good solvent vapor-containing nitrogen gas is introduced.

<Selective Removing Step>

Subsequently, after the formation of the phase-separated structure, the phase other than the phase of the block $P_A$ which is exposed is selectively removed from the layer containing the block copolymer formed on the substrate. As a result, only the phase of the block $P_A$ remains on the exposed surface within the concave portions of the pattern originally formed on the thin film. Thus, on the substrate, a pattern is formed which is constituted of only the block $P_A$, wherein the pattern reflects the pattern originally formed on the thin film, and is reduced from the originally formed pattern.

The selective removing treatment is not particularly limited, as long as it is a treatment capable of decomposing and removing the block $P_B$ and the polymer of the component (B) without affecting the block $P_A$, and may be conducted by a dry etching method or a liquid etching method. Dry etching is a method in which a reactive gas is blown on the nanophase-separated structure, and selective removal is conducted by using the difference in the decomposition rate of the polymers by the dry gas. Specific examples include an oxygen plasma treatment, a hydrogen plasma treatment and an ozone treatment.

On the other hand, the liquid etching method is a method in which a polymer in a specific polymer region of the nanophase-separated structure is selectively decomposed if desired, followed by immersing the nanophase-separated structure in a developing solution containing an organic solvent as a main component, so as to preferentially dissolve and remove a specific phase portion. In the case of liquid etching method, prior to immersing in a developing solution, among the layer containing the block copolymer formed on the substrate after forming the nanophase-separated structure, at least a portion of the phase constituted of the block $P_B$ and the polymer of the component (B) is decomposed (the molecular weight is decreased). By decomposing a portion of the block $P_B$ or the polymer of the component (B) in advance, the solubility in a developing solution can be enhanced. As a result, the phase constituted of the block $P_B$ and the polymer of the component (B) can be more reliably removed by selective removal, compared with the phase constituted of the block $P_A$.

The decomposition treatment is not particularly limited, as long as it is a treatment capable of decomposing the block $P_B$ and the polymer of the component (B) with prior to the block $P_A$. The decomposition treatment can be appropriately selected from any methods for decomposing polymers, depending on the types of the block $P_A$, the block $P_B$, and the polymer of the component (B). Examples of the decomposition treatment include an ultraviolet (UV) irradiation treatment, a heat decomposition treatment and a chemical decomposition treatment.

EXAMPLES

Although the present invention is described below by way of examples, the invention is by no way limited by these examples.

Production Example 1

A resist composition solution for forming a resist film on which a pattern is to be formed was produced.

Specifically, 100 parts by weight of a polymer represented by formula (a)-1 shown below (Mw: 10,000; polydispersity index (PDI): 1.8), 10 parts by weight of a photoacid generator represented by formula (b)-1 shown below (manufactured by Wako Pure Chemical Industries, Ltd.), 1.0 parts by weight of tri-n-amylamine, 1.5 parts by weight of salicylic acid, and 2,500 parts by weight of PGMEA were mixed together, thereby producing a resist composition solution. In formula (a)-1, the subscript numerals shown on the bottom right of the parentheses ( ) indicate the percentage (mol %) of the respective structural units.

[Chemical Formula 1]

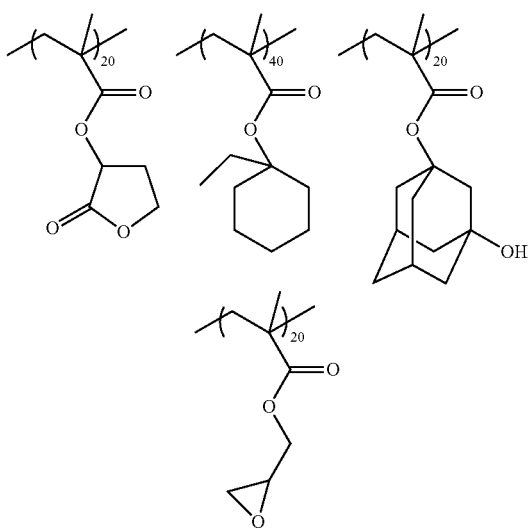

(a)-1

[Chemical Formula 2]

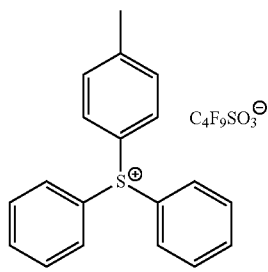

(b)-1

Example 1

First, an organic antireflection film composition (product name: ARC-29A, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 89 nm.

Then, the resist composition solution produced in Production Example 1 was applied to the organic antireflection film using a spinner, and was then prebaked (PAB) on a hotplate at 85° C. for 60 seconds and dried, thereby forming a resist film for forming a pattern having a film thickness of 100 nm.

Subsequently, the resist film for forming a pattern was selectively irradiated with an ArF excimer laser (193 nm) through a mask pattern for forming elliptically-shaped holes whose minor axis/major axis is 70/140 nm, 70/210 nm, or 70/280 nm, using an ArF exposure apparatus S609B (manufactured by Nikon Corporation, NA (numerical aperture)= 1.07, Dipole-X(0.78 to 0.97) with POLANO). Next, post exposure bake (PEB) was conducted at 125° C. for 60 seconds, and development was performed for 16 seconds using butyl acetate, followed by drying by shaking. Further, a post bake treatment was conducted at 100° C. for 1 minute, followed by 200° C. for 5 minutes, thereby forming hole patterns having ellipse shapes.

PGMEA solutions of compositions containing a PS-PMMA block copolymer 1 (molecular weight of PS: 47,000; molecular weight of PMMA: 24,000; PDI: 1.07) and PMMA polymer 1 (molecular weight of PMMA: 34,500; PDI: 2.23) with weight ratio indicated in Table 1 were spin-coated (revolution rate: 1,500 rpm; 60 seconds) on the substrate, such that the thickness of the coating as measured from the upper face of the resist film for forming a pattern became 20 nm, followed by prebaking (PAB) at 110° C. for 60 seconds, thereby forming a layer containing the PS-PMMA block copolymer 1. Subsequently, the substrate was heated at 240° C. for 60 seconds while flowing nitrogen, thereby forming a phase-separated structure.

Thereafter, using TCA-3822 (product name; manufactured by Tokyo Ohka Kogyo Co., Ltd.), the substrate was subjected to an oxygen plasma treatment (200 sccm, 40 Pa, 200W, 40° C., 20 seconds), thereby selectively removing the phase constituted of PMMA.

TABLE 1

|  | PS-PMMA block copolymer 1 (Parts by weight) | PMMA polymer 1 (Parts by weight) |
| --- | --- | --- |
| Composition 1 | 100 | 0 |
| Composition 2 | 100 | 10 |
| Composition 3 | 100 | 20 |
| Composition 4 | 100 | 30 |
| Composition 5 | 100 | 100 |

The surface of the obtained substrate was observed using a scanning electron microscope SU8000 (manufactured by Hitachi High-Technologies Corporation). FIG. 1 shows scanning electron microscope micrographs of the surface of a substrate in which hole patterns having ellipse shapes are formed (referred to as "hole pattern prior to reducing"), and of each surface of substrates in which the compositions 1 to 4 are applied thereto, phase-separated structures are formed, and then PMMA phases are removed. The micrographs of the compositions 1 and 4 indicate substrates having original elliptically-shaped hole patterns whose minor axis/major axis is 70/280 nm. The micrograph of the composition 2 indicates substrates having original elliptically-shaped hole patterns whose minor axis/major axis is 70/140 nm. The micrograph of the composition 3 indicates substrates having original elliptically-shaped hole patterns whose minor axis/major axis is 70/210 nm.

In all the substrates regardless of the shape of the elliptically-shaped hole originally formed on the resist film for forming a pattern, when the composition 1 was used, two or more small circular holes were formed per one original elliptically-shaped hole such that the diameter of the circular holes was approximately 1/2 to 1/3 the minor axis of the elliptically-shaped hole. These circular holes had substantially the same diameter as each other. When the elliptically-shaped hole originally formed was longer, the number of circular holes tended to be increased per one original elliptically-shaped hole. Specifically, when the elliptically-shaped holes were originally formed whose minor axis/major axis was 70/140 nm or 70/210 nm, two circular holes were approximately formed per one original elliptically-shaped hole. When the elliptically-shaped holes were originally formed whose minor axis/major axis was 70/280 nm, three to four circular holes were formed per one original elliptically-shaped hole.

In contrast, when the compositions 2 to 5 were used, one reduced elliptically-shaped hole was formed per one original elliptically-shaped hole, with respect to all the holes, in all the substrates regardless of the shape of the elliptically-shaped hole originally formed on the resist film for forming a pattern.

From the results, it can be confirmed that when the composition includes a PMMA polymer in addition to a PS-PMMA block copolymer, a pattern having an ellipse shape can be reduced to form a smaller elliptically-shaped pattern.

Example 2

First, similarly to Example 1, an organic antireflection film having a thickness of 85 nm was formed on an 8-inch silicon wafer. A neutralization film was formed on the organic antireflection film, and then the resist composition solution produced in Production Example 1 was applied thereto, thereby forming a resist film for forming a pattern.

The resist film for forming a pattern was selectively irradiated with an ArF excimer laser (193 nm) through a mask pattern for forming elliptically-shaped holes in which the minor axis thereof was 60 nm, 65 nm or 70 nm and the ratio of the minor axis/major axis is 1/2, 1/3, 1/4, 1/5 or 1/6, using an ArF exposure apparatus S609B (manufactured by Nikon Corporation, NA (numerical aperture)=1.07, Dipole-X (0.78 to 0.97) with POLANO). Next, post exposure bake (PEB) was conducted at 125° C. for 60 seconds, and development was performed for 16 seconds using butyl acetate, followed by drying by shaking. Further, a post bake treatment was conducted at 100° C. for 1 minute, followed by 200° C. for 5 minutes, thereby forming hole patterns having ellipse shapes.

A PGMEA solution of a composition (composition 6) containing 50 parts by weight of an acrylic polymer 1 represented by formula (A)-1 shown below (Mw: 25,000; PDT: 1.85) (in the formula (A)-1, the subscript numerals shown on the bottom right of the parentheses ( ) indicate the percentage (mol %) of each structural unit), relative to 100 parts by weight of the PS-PMMA block copolymer 1 used in Example 1 was spin-coated (revolution rate: 1,500 rpm; 60 seconds) on the substrate, such that the thickness of the coating as measured from the upper face of the resist film for forming a pattern became 20 nm, followed by prebaking (PAB) at 110° C. for 60 seconds, thereby forming a layer containing the PS-PMMA block copolymer 1. Subsequently, the substrate was heated at 240° C. for 60 seconds while flowing nitrogen, thereby forming a phase-separated structure.

Thereafter, using TCA-3822 (product name; manufactured by Tokyo Ohka Kogyo Co., Ltd.), the substrate was subjected to an oxygen plasma treatment (200 sccm, 40 Pa, 200 W, 40° C., 20 seconds), thereby selectively removing the phase constituted of PMMA.

[Chemical Formula 3]

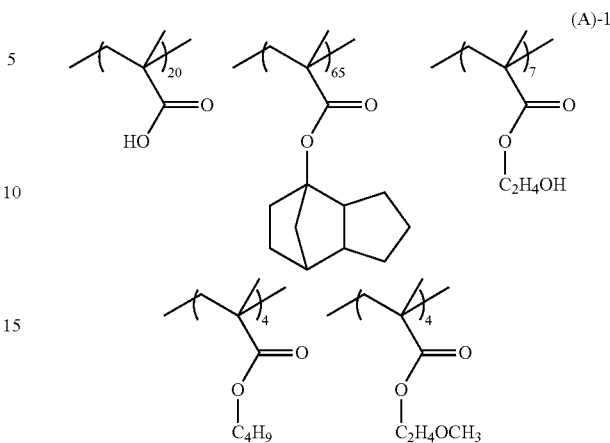

The surface of the obtained substrate was observed in the same manner as Example 1. When the minor axis of the elliptically-shaped hole pattern originally formed on the resist film for forming a pattern was 60 nm, one reduced elliptically-shaped hole was formed per one original elliptically-shaped hole, with respect to approximately all the holes, in all the substrates regardless of the ratio of the minor axis/major axis of the original elliptically-shaped hole. From the results, it was found that when the composition includes an acrylic polymer in addition to a PS-PMMA block copolymer, a pattern having ellipse shape can be reduced to form a smaller elliptically-shaped pattern.

On the other hand, in the case where the minor axis of the elliptically-shaped hole pattern originally formed on the resist film for forming a pattern was 65 nm, if the major axis of the original elliptically-shaped hole was not so long (that is, the ratio of the minor axis/major axis was 1/5 or more), one reduced elliptically-shaped hole was formed per one original elliptically-shaped hole. If the ratio of the minor axis/major axis of the original elliptically-shaped hole was 1/6, in terms of most of the original elliptically-shaped hole, an elliptically-shaped phase constituted of the PS remaining in the center of the original elliptically-shaped hole, and the periphery of the elliptically-shaped phase constituted of the PS was selectively removed.

Figure 2:
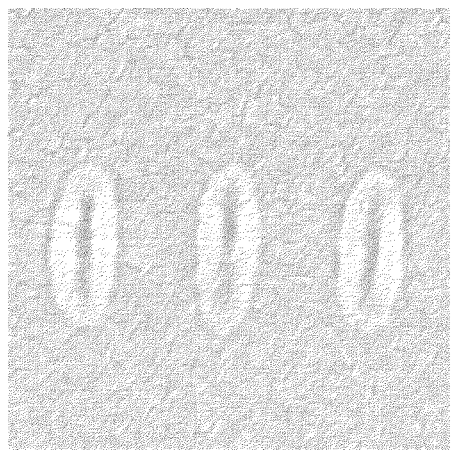
FIG. 2 is a scanning electron microscope micrograph, with respect to Example 2, of the surface of a substrate in which the minor axis of the elliptically shaped hole pattern originally formed is 70 nm, and the major axis thereof is 210 nm, and the original elliptically-shaped hole pattern is reduced.

Similarly, in the case where the minor axis of the elliptically-shaped hole pattern originally formed on the resist film for forming a pattern was 70 nm, if the ratio of the minor axis/major axis of the original elliptically-shaped hole was 1/2 or 1/3, one reduced elliptically-shaped hole was formed per one original elliptically-shaped hole. However, if the ratio of the minor axis/major axis was 1/4 to 1/6, in terms of most of the original elliptically-shaped hole, an elliptically-shaped phase constituted of the PS remaining in the center of the original elliptically-shaped hole, and periphery of the elliptically-shaped phase constituted of the PS was selectively removed. FIG. 2 shows a scanning electron microscope micrograph of the surface of a substrate in which the minor axis of the elliptically-shaped hole pattern originally formed is 70 nm, and the major axis thereof is 210 nm, and the original elliptically-shaped hole pattern is reduced.

The reason of remaining the elliptically-shaped phase constituted of the PS in the center of the original elliptically-shaped hole is as follows. Since the amount of the acrylic polymer within the used composition is smaller with respect to the cross-sectional area of the hole pattern originally formed on the substrate, the phase constituted of the PMMA polymer and the acrylic polymer can not be sufficiently expanded. It is presumed that when the amount of the acrylic polymer contained in the PS-PMMA block copolymer is increased, one reduced elliptically-shaped hole can be formed per one original elliptically-shaped hole.

Example 3

First, similarly to Example 1, an organic antireflection film having a thickness of 85 nm was formed on an 8-inch silicon wafer. A neutralization film was formed on the organic antireflection film, and then the resist composition solution produced in Production Example 1 was applied thereto, thereby forming a resist film for forming a pattern. Then, the pattern was formed on the resist film for forming a pattern in the same manner as Example 2 except that circular patterns having a diameter of 100, 105, 110, 115 or 120 nm were formed in the resist film for forming a pattern on the substrate. Subsequently, a layer containing the PS-PMMA block copolymer 1 was formed on the pattern using the composition 1 used in Example 1 or the composition 6 used in Example 2, and then a phase-separated structure was formed. Thereafter, the phase constituted of PMMA was selectively removed.

Figure 3:
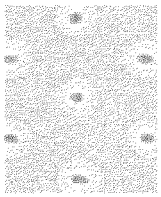
FIG. 3 is scanning electron microscope micrographs, with respect to Example 3, of each surface of substrates in which the composition 1 or 6 is applied to the substrate in which circular hole patterns having each diameter are formed, phase-separated structures are formed, and then PMMA phases are removed.

The surface of the obtained substrate was observed in the same manner as Example 1. FIG. 3 shows scanning electron microscope micrographs of each surface of substrates in which the composition 1 or 6 is applied to the substrate in which circular hole patterns having each diameter are formed, phase-separated structures are formed, and then PMMA phases are removed. When the composition 6 was used, one reduced circular hole was formed per one original circular hole, with respect to approximately all the holes, regardless of the diameter of the circular hole pattern originally formed on the resist film for forming a pattern. On the other hand, in the case where the composition 1 containing only the PS-PMMA block copolymer 1 was used, when the diameter of the circular hole pattern originally formed was 100 nm, similarly to the case in composition 6, one reduced circular hole was formed per one original circular hole; however, when the diameter of the circular hole pattern originally formed was 105 nm or more, two reduced circular holes were formed per one original circular hole. From the results, it was found that when the composition includes an acrylic polymer in addition to a PS-PMMA block copolymer, a circular pattern can be reduced to form a smaller circular pattern.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of reducing a pattern comprising:
   forming a first hole pattern having an ellipse shape in the cross-section on a substrate having a thin film thereon,
   forming a block copolymer layer such that a layer containing a block copolymer is formed on the substrate having the hole pattern formed on a surface thereof using a block polymer composition, so as to cover the bottom of concave portions of the hole pattern;
   separating a phase such that the layer containing the block copolymer is subjected to phase separation after forming the block copolymer layer; and
   selectively removing a phase of blocks other than the block $P_A$ within the layer constituting the block copolymer after separating the phase, thereby forming a second hole pattern in which one hole having an ellipse shape in the cross-section and a reduced size is formed in each hole of the first hole pattern,
   wherein the ellipse shape of the first hole pattern has a minor axis/major axis ratio of 1/3 to 1/2, and the minor axis being in the range of 60 to 70 nm and the major axis being in the range of 140 to 280 nm, and
   wherein the block polymer composition consists of:
   a polystyrene-poly(methyl methacrylate) block copolymer; and
   a poly(methyl methacrylate) homopolymer,
   wherein the amount of the poly(methyl methacrylate) homopolymer is 25 parts by weight, relative to 100 parts by weight of polystyrene-poly(methyl methacrylate) block copolymer.

2. The method of reducing a pattern according to claim 1, wherein the thin film is a resist film.

* * * * *